May 17, 1966 H. D. BARTELS 3,252,017

PIEZOELECTRIC OSCILLATOR HAVING A HIGH COUPLING FACTOR

Filed June 24, 1963

United States Patent Office 3,252,017
Patented May 17, 1966

3,252,017
PIEZOELECTRIC OSCILLATOR HAVING A HIGH COUPLING FACTOR

Hans Dietrich Bartels, Deisenhofen, Germany, assignor to Siemens & Halske Aktiengesellschaft, Berlin and Munich, Germany, a corporation of Germany
Filed June 24, 1963, Ser. No. 290,026
Claims priority, application Germany, June 27, 1962, S 80,086
10 Claims. (Cl. 310—9.8)

The present invention relates to piezoelectric oscillators which are used for instance as electrical filter elements.

Known piezoelectric oscillators of this kind comprise, for instance, a metallic base, on which is fastened a piezoelectric ceramic wafer. On the piezoelectric wafer is provided an electrically conductive coating. The wafer is biased (pre-polarized), for example, in the direction from the electrically conductive coating to the metal base. For the production of oscillations, an electric alternating voltage is applied between the metal base and the electrically conductive coating so that electric alternating fields can develop between the corresponding parts within the piezoelectric wafer, resulting in mechanical oscillations.

The various objects and features of the invention will appear from the description which is rendered below with reference to the accompanying drawings.

Figures 1, 2, 3, 4, 5, 6, 7, 8, 9, 10, 11, 12:
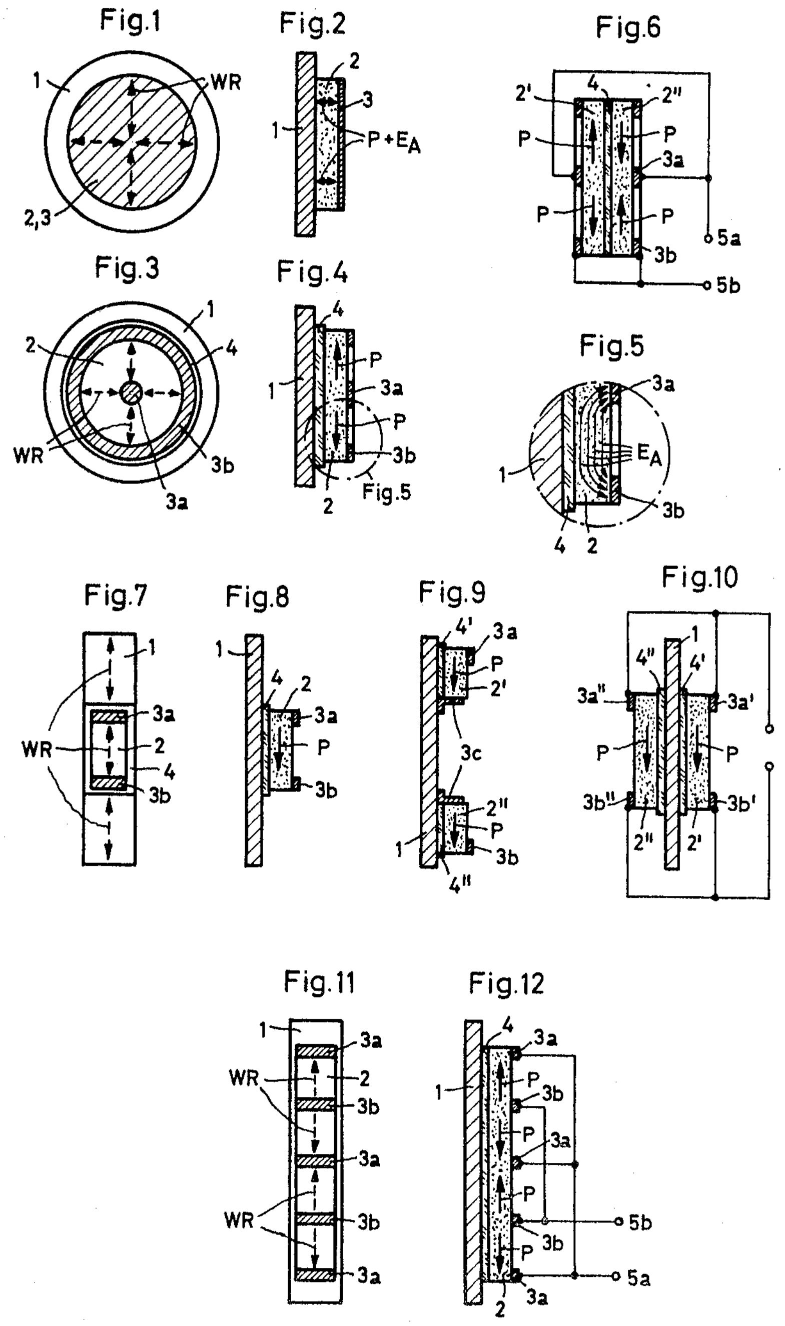
FIGS. 1 and 2 show a known circular oscillator.
FIGS. 3 to 12 show examples of piezoelectric oscillators in accordance with the invention.

In the known piezoelectric oscillators in which biasing (polarizing) and electric field are parallel or antiparallel to each other, the direction of propagation of the mechanical wave, for example of the elongation or expansion wave, is substantially perpendicular to the biasing direction. If there is concerned, for instance, a circular oscillator in accordance with FIGS. 1 and 2, then the direction of propagation of the wave is radially outward from the centerpoint of the circular oscillating element. It is then perpendicular to the direction of the biasing and of the electrical field in the piezoelectric disk.

The coupling factor $k$ of a piezoelectric element is defined as the square root of the ratio of the mechanical energy given off to the electrical energy absorbed. The piezoelectric constant $d$ is the ratio between the relative change in length or thickness and the electrical field.

$$d=\frac{\Delta l/l}{\mathfrak{F}}$$

The object of the invention is to increase this coupling factor. By increasing this coupling factor, it should be possible to increase the band width in the case of filters which are constructed of such piezoelectric oscillators.

In accordance with the invention, this object is achieved by arranging the electrodes so that the mechanical wave produced by the excitation is propagated substantially parallel or antiparallel to the direction of the biasing (polarizing) and excitation field, and by separating the piezoelectric disks from each other and from the metallic base by an insulating layer having a dielectric constant which is low with respect to the piezoelectric parts and which has a low electrical conductivity. Accordingly, the invention proposes to effect a direct excitation of the piezoelectric oscillator. There is in this manner surprisingly obtained a square of the coupling factor which is a multiple, for instance ten times, that which could be obtained with the piezoelectric oscillators heretofore known. By utilization of the greater coupling factor, there is obtained a more favorable ratio between apparent and real power. For the same coupling factor, the proportion of ceramic in the oscillator can be reduced, which results in advantages, for example, with respect to the constancy of the oscillator.

A thin layer of glass is preferably used as low dielectric insulating separating layer. This layer of glass can be bonded, for example, to the metal base or may be applied directly to the metal base. The insulating separating layer having a dielectric constant which is low with respect to the piezoelectric part, has the object of allowing the electric fields between the electrodes arranged correspondingly on the piezoelectric disks, to travel substantially in the direction of propagation of the mechanical wave. If this insulating layer were absent, then the electrical field would, corresponding to the lowest electrical resistance, assume a course from one electrode via the piezoelectric to the metal base and from there back via the piezoelectric to the other electrode. In such case, the electric fields would not be parallel to the direction of propagation of the mechanical wave, as required by the invention, but rather aligned substantially perpendicular thereto, so that the advantage of the invention, namely, increase of the coupling factor or coefficient, can be obtained only to negligible extent, if at all. If glass, for example, is used as a separating layer, then the dielectric constant of this layer, of $\epsilon=5$, is more than two tens powers less than the dielectric constant of a piezoelectric of barium titanate of about $\epsilon=2000$. The electric conductivity of glass is extremely slight. If the electric conductivity of the separating layer appears too high, then the electrical conductivity of the piezoelectric can be increased by additions.

FIGS. 1 and 2 show a circular piezoelectric oscillator having a metallic base 1 as well as a circular piezoelectric disk 2 and an electrically conductive coating 3 precipitated thereon. Upon the application of electric alternating voltage between the metal disk 1 and the electric coating 3, and biasing the piezoelectric disk in the direction from the coating to the metal disk or vice versa, this element is capable of carrying out oscillations, the direction of propagation of the mechanical wave WR extending radially from the centerpoint of the disk outward and therefore at right angles to the biasing and direction of the electric field. In FIG. 2, which shows a cross-sectional view of the element shown in FIG. 1, the direction of the biasing is indicated by P and the excitation by the electric fields is indicated by $E_A$.

FIG. 3 shows in elevational view a circular oscillating element in accordance with the invention, with piezoelectric excitation and FIG. 4 shows a cross-section thereof. A piezoelectric disk 2 is arranged on a metal base 1 of Thermelast steel. In accordance with the invention, between the ceramic disk 2 and the metallic base 1, there is a separating layer 4 of low dielectric strength and low electrical conductivity, for instance of glass. The electrodes are in accordance with the invention arranged in the form of a circular electrode $3a$ in the center of the circular disk and of an annular electrode $3b$ on the periphery of the piezoelectric disk. The direction of propagation of the mechanical wave WR is also pronouncedly in radial direction. It can be noted that the insulating separating layer 4 prevents contact between the metal base 1 and the piezoelectric disk 2. The biasing P is radial from the center of the circular disk toward the periphery, that is, parallel or antiparallel to the direction of propagation of the mechanical wave WR. The electrical field $E_A$ also extends substantially parallel or antiparallel to the biasing in accordance with the portion of FIG. 4 shown in FIG. 5.

FIG. 6 shows in cross-sectional view another embodiment of a piezoelectric oscillator in accordance with the invention. This oscillator comprises two piezoelectric disks 2′ and 2″ which are separated by an electrically insulating separating layer 4 of low dielectric constant as compared with that of the piezoelectric disks. On the outer sides of the circular piezoelectric disks, peripherally thereof, there are applied annular coatings 3*b* which are connected with the terminal 5*b*, and in the center are disposed circular coatings 3*a* which are connected with the terminal 5*a*. The biasing of the piezoelectric disks is in direction P in the disk 2′, radially from the inside to the outside, and in the disk 2″ radially from the outside to the inside. The piezoelectric oscillating element executes mechanical oscillations upon application of alternating voltages of suitable frequency to the terminals 5*a* and 5*b*.

FIG. 7 shows in elevational view a bar flexure oscillator in accordance with the invention and FIG. 8 shows a cross-sectional view thereof. On a bar-shaped metallic base plate 1 is fastened a ceramic piezoelectric wafer 2 with the interposition of a separating layer 4 in accordance with the invention. At the ends of this piezoelectric wafer are arranged electrodes formed by coatings 3*a* and 3*b*. Electric fields are formed between these electrodes in the piezoelectric wafer, upon the application of alternating voltage to the electrodes 3*a* and 3*b*, which upon biasing in approximately parallel or antiparallel direction, give rise to oscillations. The direction of propagation of the mechanical wave WR is parallel or antiparallel to the direction of the biasing and of the electric fields. The separating layer 4 prevents a sensitive deviation of the electrical fields in the direction toward the metallic base 1.

FIG. 9 shows another example of a piezoelectric oscillator in accordance with the invention, in which two piezoelectric wafers 2′ and 2″ are arranged on a bar-shaped metal base 1, with the interposition of separating layers 4′ and 4″ in accordance with the invention. On the upper end of the wafer 2′, there is applied an electrically conductive coating 3*a* and at the lower end of the other wafer 2″ another conductive coating 3*b*. Further electrically conductive coating 3*c* for connecting the two piezoelectric wafers electrically with each other. The electrical fields extend substantially parallel or antiparallel to the biasing direction P and the direction of propagation of the mechanical wave also corresponds to this course.

FIG. 10 shows a piezoelectric oscillator in accordance with the invention, comprising two piezoelectric disks 2′ and 2″ and a metallic base 1, the piezoelectric disks being arranged on opposite sides of the metal base 1 with the interposition of two separating layers 4′ and 4″. In accordance with the arrangement of the electrodes 3*a*′, 3*a*″ and 3*b*′, 3*b*″ and the connection thereof shown in this example, the electrical fields extend substantially parallel to the biasing P from the electrodes 3*a* to the electrodes 3*b*.

FIGS. 11 and 12 show respectively in elevation and cross-section, a further embodiment of the invention. On a metallic base or supporting body 1 is arranged with the interposition of the separating layer 4 (omitted in FIG. 11), a ceramic piezoelectric bar-shaped wafer 2, and on the latter are disposed a plurality of electrically conductive coatings. As shown in FIG. 12, the respective coatings 3*a* and 3*b* are contacted with each other in such a manner that upon the application of voltage to the terminals 5*a* and 5*b*, the electric alternating fields in the individual sections of the ceramic body 2, located between electrodes, extend, depending on their phase, parallel to the biasing P or antiparallel thereto. This division is effected in order to counteract the apparent resistance (impedance) which is increased by the elongated shape and the large spacing of the electrodes in the absence of the intermediate electrodes corresponding to the reduced capacitance and the increased electrical resistance. It may be noted here that it has been found that the electrical conductivity and/or the capacitance between the electrodes serving for the excitation over the ceramic are so small, as compared with the conductivity and the capacitance between the ceramic and the metal base 1, that there occurs a parallel electric apparent resistance (impedance) which reduces the resultant coupling coefficient of the oscillator. By dividing the total ceramic path into individual sections which are connected in parallel, the apparent resistance (impedance) between the electrodes 3*a* and 3*b* is again reduced to such an extent that the admittance between the electrodes *a* and *b* on the one hand and the metal on the other hand is again negligibly small.

A plurality of rings for subdividing the field can also be provided in case of a circular oscillator, corresponding, for example, to FIGS. 3 and 4 or 6.

Changes may be made within the scope and spirit of the appended claims which define what is believed to be new and desired to have protected by Letters Patent.

I claim:

1. A piezoelectric oscillator comprising at least one piezoelectric prepolarized disk, at least two electrodes operatively connected to said disk and serving for the excitation thereof by which the electric alternating field in the piezoelectric is established substantially in a direction selected from the class of directions which extend parallel and antiparallel to the direction of polarization, said electrodes being so arranged that the propagation of the mechanical wave, produced by the excitation, is in a direction corresponding to one of said polarization directions, and an insulating layer, contacting one side of said disk, having a dielectric constant which is low with respect to that of the piezoelectric and having a low electrical conductivity, thereby assuring that the electric field between said electrodes travels substantially in the direction of the propagation of the mechanical wave.

2. A piezoelectric oscillator according to claim 1, wherein a plurality of prepolarized piezoelectric disks are employed, said disks being mechanically interconnected and each provided with electrodes for the excitation thereof, said insulating layer being disposed between said disks.

3. A piezoelectric oscillator according to claim 2, wherein the electrodes are so arranged that the generated mechanical wave propagates in a direction substantially opposite to the direction of polarization.

4. A piezoelectric oscillator according to claim 1, comprising in further combination a metallic base, at least one such piezoelectric disk being connected with said base as well as with the exciting electrodes, said insulating layer being disposed between said base and said disk, the electrodes being so arranged that the generated mechanical wave propagates in a direction substantially parallel with the direction of the polarization.

5. A piezoelectric oscillator according to claim 4, wherein the electrodes are so arranged that the generated mechanical wave propagates in a direction substantially antiparallel to the direction of polarization.

6. A piezoelectric oscillator according to claim 1, wherein glass is used as the insulating layer.

7. A piezoelectric oscillator according to claim 1, wherein the oscillator is made in the shape of a circular plate-like structure comprising a metal base, an insulating layer and a ceramic piezoelectric disk, said electrodes comprising an inner circular electrode having a diameter which is small as compared with the diameter of the oscillator, and an outer electrode in the form of an annular ring having an inner diameter which is large as compared with the diameter of the inner electrode.

8. A piezoelectric oscillator according to claim 1, wherein the oscillator is made in the shape of a circular plate-like structure comprising two such ceramic piezoelectric disks separated by said insulating layer, said electrodes comprising, for each disk, a central inner electrode having a diameter which is small as compared with the oscillator diameter, and an outer annular electrode having an inner diameter which is large as compared with the diameter of the inner electrode.

9. A piezoelectric oscillator according to claim 4, wherein the oscillator is made in the form of a bar-shaped structure, said base comprising a metal bar, said electrodes being arranged on the ceramic disk in strip form transverse to the direction of the bar.

10. A piezoelectric oscillator according to claim 9, wherein a plurality of electrodes are arranged on the ceramic disk, and means for connecting with each other the respective even numbered and odd numbered electrodes.

References Cited by the Examiner

UNITED STATES PATENTS

| | | | |
|---|---|---|---|
| 2,969,512 | 1/1961 | Jaffee et al. | 310—9.7 |
| 3,091,708 | 5/1963 | Harris et al. | 310—8.3 |

ORIS L. RADER, *Primary Examiner.*

MILTON O. HIRSHFIELD, A. J. ROSSI, *Assistant Examiners.*